US009937528B2

(12) United States Patent
Johnson et al.

(10) Patent No.: US 9,937,528 B2
(45) Date of Patent: Apr. 10, 2018

(54) CAPACITIVE MICROMACHINED ULTRASONIC TRANSDUCER (CMUT) FORMING

(71) Applicant: Texas Instruments Incorporated, Dallas, TX (US)

(72) Inventors: Peter B. Johnson, Sunnyvale, CA (US); Ira Oaktree Wygant, Palo Alto, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 199 days.

(21) Appl. No.: 15/095,264

(22) Filed: Apr. 11, 2016

(65) Prior Publication Data

US 2016/0221038 A1 Aug. 4, 2016

Related U.S. Application Data

(62) Division of application No. 13/779,210, filed on Feb. 27, 2013, now Pat. No. 9,351,081.

(51) Int. Cl.
*H01B 13/00* (2006.01)
*B06B 1/02* (2006.01)
(Continued)

(52) U.S. Cl.
CPC ........ *B06B 1/0292* (2013.01); *B81C 1/00301* (2013.01); *H02N 1/006* (2013.01);
(Continued)

(58) Field of Classification Search
CPC . B06B 1/0292; H04R 19/005; B81C 1/00301; H05K 2201/09845; H05K 2201/09863; Y10S 148/05
(Continued)

(56) References Cited

U.S. PATENT DOCUMENTS 4,889,832 A 12/1989 Chatterjee
6,828,656 B2 12/2004 Forbes et al.
(Continued)

FOREIGN PATENT DOCUMENTS

CN 102520032 A 6/2012
CN 102728533 A 10/2012
(Continued)

OTHER PUBLICATIONS

The State Intellectual Property Office of P.R.C. Notification of First Office Action. Date of Issue: Sep. 27, 2016.
(Continued)

*Primary Examiner* — Binh X Tran
(74) *Attorney, Agent, or Firm* — Andrew R. Ralston; Charles A. Brill; Frank D. Cimino

(57) ABSTRACT

A Capacitive Micromachined Ultrasonic Transducer (CMUT) device including at least one CMUT element with at least one CMUT cell is formed. A patterned dielectric layer thereon including a thick and a thin dielectric region is formed on a top side of a single crystal material substrate. A second substrate is bonded to the thick dielectric region to provide at least one sealed micro-electro-mechanical system (MEMS) cavity. The second substrate is thinned to reduce a thickness of said second substrate to provide a membrane layer. The membrane layer is etched to form a movable membrane over said MEMS cavity and to remove said membrane layer over said top side substrate contact area. The thin dielectric region is removed from over said top side substrate contact area. A top side metal layer is formed including a trace portion coupling said top side substrate contact area to said movable membrane. From a bottom side surface of said first substrate, etching is performed to open an isolation trench around said single crystal material to form a through-substrate via (TSV) plug of said single
(Continued)

crystal material at least under said top side substrate contact area which is electrically isolated from surrounding regions of said single crystal material.

11 Claims, 10 Drawing Sheets

(51) Int. Cl.
  *H02N 1/00* (2006.01)
  *H04R 19/00* (2006.01)
  *B81C 1/00* (2006.01)
  *B81B 7/00* (2006.01)

(52) U.S. Cl.
  CPC ........ *H04R 19/005* (2013.01); *B06B 2201/76* (2013.01); *B81B 7/007* (2013.01); *B81B 2203/0127* (2013.01); *B81B 2207/096* (2013.01); *B81C 2201/013* (2013.01); *B81C 2203/036* (2013.01); *H05K 2201/09845* (2013.01); *H05K 2201/09863* (2013.01)

(58) Field of Classification Search
  USPC .......................................... 216/13, 17, 19, 39
  See application file for complete search history.

(56) References Cited

U.S. PATENT DOCUMENTS

| | | | |
|---|---|---|---|
| 7,799,678 | B2 | 9/2010 | Kropewnicki et al. |
| 8,143,704 | B2 | 3/2012 | West |
| 8,324,006 | B1 | 12/2012 | Adler et al. |
| 8,957,504 | B2 | 2/2015 | Chao-Yuan et al. |
| 2006/0075818 | A1 | 4/2006 | Huang et al. |
| 2007/0215964 | A1 | 9/2007 | Khuri-Yakub et al. |
| 2008/0194053 | A1 | 8/2008 | Huang |
| 2008/0203556 | A1 | 8/2008 | Huang |
| 2011/0071397 | A1 | 3/2011 | Wodnicki et al. |
| 2011/0115333 | A1 | 5/2011 | Ezaki |
| 2011/0213592 | A1* | 9/2011 | Adachi ................ A61B 8/12 702/191 |
| 2011/0242932 | A1 | 10/2011 | Lebental et al. |
| 2012/0182557 | A1 | 7/2012 | Kilic et al. |
| 2012/0187508 | A1* | 7/2012 | Adler ................ B06B 1/0292 257/416 |
| 2013/0087867 | A1* | 4/2013 | Ho ................ B06B 1/0292 257/419 |
| 2013/0249023 | A1* | 9/2013 | Adler ................ H01L 29/84 257/416 |
| 2014/0239768 | A1 | 8/2014 | Johnson et al. |
| 2014/0239769 | A1 | 8/2014 | Johnson et al. |
| 2014/0307528 | A1* | 10/2014 | Dekker ................ B06B 1/0292 367/178 |
| 2016/0363609 | A1* | 12/2016 | Wygant ................ B81B 7/007 |

FOREIGN PATENT DOCUMENTS

| | | |
|---|---|---|
| WO | 2006123298 A3 | 11/2006 |
| WO | 2010032156 A2 | 3/2010 |

OTHER PUBLICATIONS

Notification of Transmittal of the International Search Report and the Written Opinion of the International Searching Authority, or the Declaration; dated Jun. 5, 2014.

Xuefeng Zhuang, et al., "Wafer-Bonded 2-D CMUT Arrays Incorporating Through-Wafer Trench-Isolated Interconnects with a Supporting Frame," IEEE Transactions on Ultrasonics, Ferroelectrics and Frequency Control, vol. 56, No. 1, pp. 182-192, Jan. 2009.

European Search Report, dated Jan. 23, 2017.

* cited by examiner

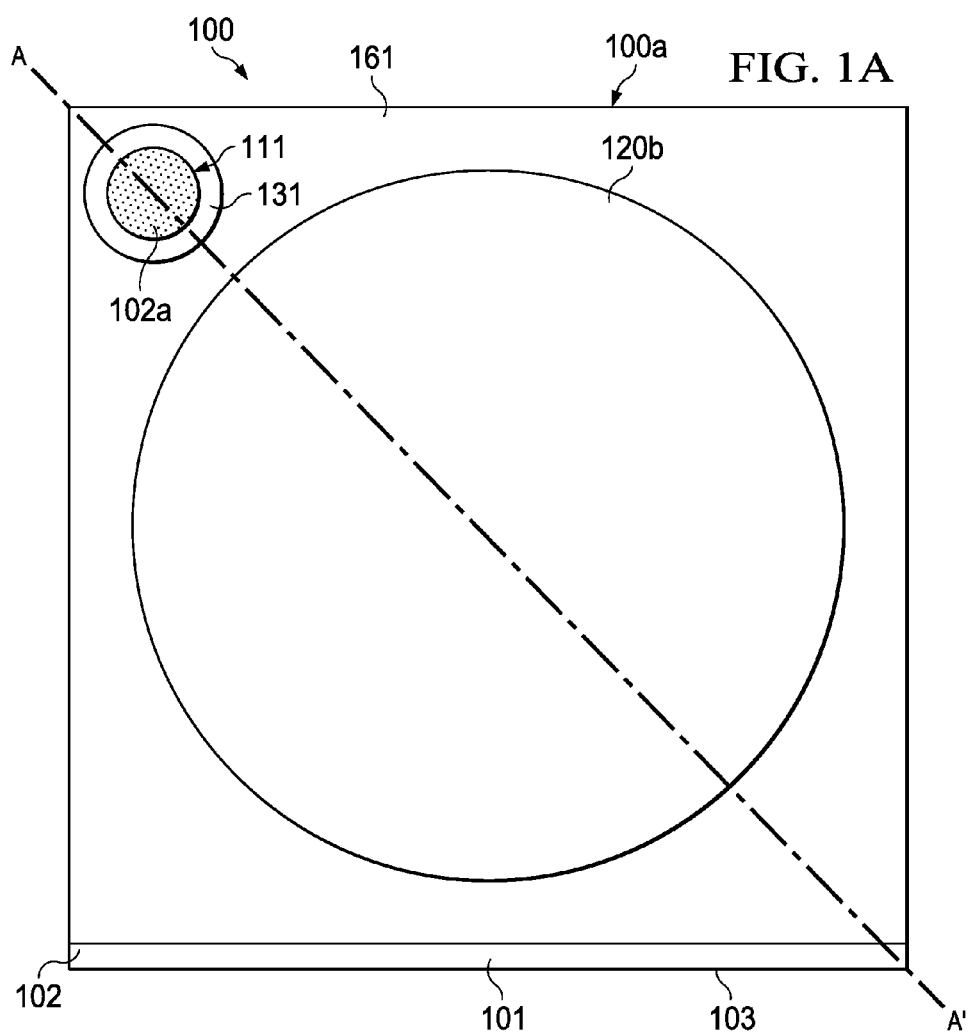

CAPACITIVE MICROMACHINED ULTRASONIC TRANSDUCER (CMUT) FORMING

CROSS REFERENCE TO RELATED APPLICATIONS

This application is a Divisional of and claims benefit to U.S. patent application Ser. No. 13/779,210 filed Feb. 27, 2013, now U.S. Pat. No. 9,351,081 B2. Said application herein incorporated by reference in its entirety.

FIELD

Disclosed embodiments relate to methods of forming capacitive micromachined ultrasonic transducer (CMUT) devices and CMUT devices therefrom.

BACKGROUND

CMUT devices are becoming increasingly popular in medical applications. For example, CMUT devices have been used to improve medical ultrasound imaging probes. CMUT devices have also been used to provide high-intensity focused ultrasound for use in medical therapy. Additionally, CMUT devices can be used to generate airborne ultrasound for multiple applications including gesture sensing and gas flow monitoring. Conventional CMUT devices are typically produced directly on a silicon substrate (i.e. on a silicon wafer). For instance, conventional CMUT devices are often fabricated using a micro-electro-mechanical system (MEMS) manufacturing technique in which a release layer is etched out, leaving a free-standing (flexible) membrane. The top of the membrane is typically metalized to reduce the resistance of the top (electrode) plate, and the membrane is then used as a transducer to transmit and receive ultrasonic signals.

CMUT devices (a CMUT die or array) are comprised of one or more CMUT elements, and each CMUT element can contain one of more CMUT cells. Conventional CMUT devices utilize bond pads to provide electrical contact to the top plate for each of the CMUT elements in the array, such as a plurality of bond pads for a CMUT device including a plurality of CMUT elements arranged in a CMUT array. Since the bond wire is elevated above the bond pad, the bond pad is placed remote from the CMUT elements in the CMUT array to facilitate packaging. This constraint not only increases the CMUT array die size due to the need for interconnect routing lines, but also reduces performance and complicates the packaging process. Both the increased die size and the complicated packaging process increase the cost of packaged CMUT die.

SUMMARY

Disclosed embodiments describe solutions to the CMUT device problems with conventional utilization of bond pads for connection to the top plate of each CMUT element which is recognized to substantially constrain the design and increase the size of CMUT devices, including 2 dimensional (2D) CMUT arrays of CMUT elements. To connect the bond pads to each CMUT element of a large 2D CMUT array (e.g., ≥a 10×10 array of CMUT elements) involves extensive use of interconnect traces on the top side of the CMUT die, thereby increasing the die size and reducing CMUT performance.

Disclosed embodiments include CMUT devices having through-substrate via (TSV) plugs of the single crystal material (e.g., silicon) of the substrate to allow bottom side contact to make connections to the top plate of the CMUT elements through the die with the single crystal substrate material to facilitate the production of 2D CMUT arrays. One conventional TSV process flow utilizes a deep substrate etch (e.g., Bosch etch) to form embedded vias, add a dielectric liner to the embedded vias, tungsten (W) or copper (Cu) fill of the embedded lined TSV vias, then uses a reveal process to expose the TSVs. Such TSV structures require the use of multiple, time consuming, expensive process steps, such as the deep Si via etch to form the embedded vias, and in the case of Cu, thick Cu electroplating and chemical mechanical planarization (CMP) of thick Cu films.

Disclosed methods utilize the single crystal material (e.g., a single crystal silicon substrate) as the electrically conductive material for the TSVs. Conventional thick Cu plating and the Cu CMP steps for forming TSVs are thus eliminated. Only a deep substrate (e.g., silicon etch, such as a Bosch etch) remains to form disclosed TSVs, simplifying the CMUT fabrication process.

BRIEF DESCRIPTION OF THE DRAWINGS

Reference will now be made to the accompanying drawings, which are not necessarily drawn to scale, wherein:

FIG. 1A is a top view depiction an example CMUT device shown as a CMUT element with a single CMUT cell, according to an example embodiment.

DETAILED DESCRIPTION

Figure 1B:
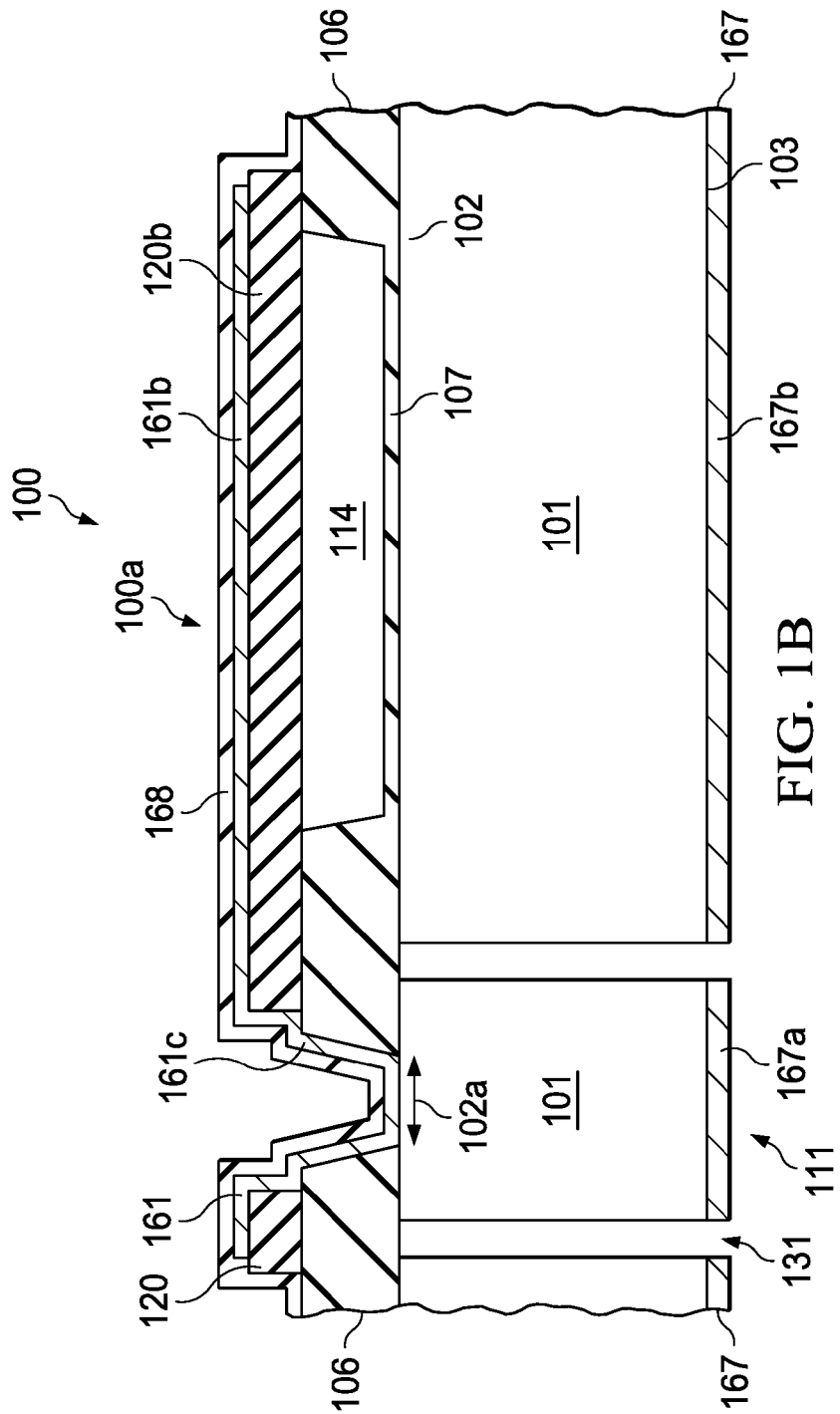
FIG. 1B is cross sectional depiction of the example CMUT device/element/cell shown in FIG. 1A along the cut line A-A' shown.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Regarding nomenclature used herein, the smallest CMUT sensor entity is a CMUT sensor cell. Multiple CMUT sensor cells can be connected in parallel (e.g., with an electrically common movable membrane 120b) to form a CMUT element. A CMUT element can have any number (≥1) of CMUT cells. Typically the more CMUT cells in an element the greater the ultrasonic output pressure that the element can generate responsive to a given stimulus. A CMUT array (device/die) can have any number of CMUT elements. One of the electrodes, (e.g., the top electrode) of the respective CMUT elements can be electrically isolated from one another to allow each CMUT element to be connected independently to be individually addressable. As described herein, using an electrically common movable membranes 120b for each CMUT cell in a CMUT element allows all the cells in each element to be addressed by a single TSV.

FIG. 1A is a top view depiction an example CMUT device 100 shown as a CMUT element with a single CMUT cell 100a, according to an example embodiment along with a cut line A-A' provided for the cross sectional depiction shown in FIG. 1B and other FIGS. 2A-G described below. The CMUT cell 100a includes a first substrate 101 of a single crystal material (e.g., bulk single crystal silicon or a silicon epitaxial layer on a single crystal substrate) having a top side 102 and a bottom side 103.

As shown in FIG. 1B, the top side 102 includes a patterned dielectric layer thereon including thick dielectric regions 106 and thin dielectric regions 107. A through-substrate via (TSV) 111 extends a full thickness of the first substrate 101 to the bottom side 103 of the first substrate 101. The TSV 111 is formed of the single crystal material of the first substrate 101, is electrically isolated by an isolation region (e.g., trench ring) 131 electrically isolating the TSV 111 from the surrounding regions of the single crystal material. TSV 111 is positioned under a top side contact area 102a of the first substrate 101.

The membrane layer 120 of the second substrate shown as a SOI substrate 115 (depicted in FIG. 2A) is bonded (e.g., vacuum bonded or vacuum fusion bonded) to the thick dielectric regions 106 and is over the thin dielectric regions 107 of the first substrate 101 to provide a movable membrane 120b over the MEMS cavities 114 shown. A patterned top side metal layer (e.g., AlCu) 161 is over the top side substrate contact area 102a and over the movable membrane 120b including a portion 161c coupling the top side contact area 102a to the movable membrane 120b and a portion 161b over the movable membrane 120b.

The first substrate 101 can comprise single crystal silicon, or epitaxial silicon on single crystal silicon. The first substrate 101 typically has a resistivity less than or equal to (≤) 0.1 Ω-cm, and can be doped p-type or n-type. CMUT cell 100a is shown including a patterned backside metal layer 167 on a bottom side 103 of the first substrate 101 including a first patterned layer portion 167a contacting bottom side of the TSV 111 (to provide a first electrode contact, to the movable top plate) and a second patterned layer portion 167b contacting the bottom side 103 of the first substrate 101 lateral to the TSV 111 to provide a second fixed electrode contact. No top side contact, nor bond pads are thus needed by CMUT device 100.

It is noted CMUT device thicknesses and dimensions can be adjusted to fit specific applications. For example, typical example dimensions for an airborne ultrasound application at 180 kHz operation is a CMUT cell having a movable membrane 120b 1.12 mm in diameter, patterned top side metal layer 161 plate width of 1.32 mm (100 µm plate overlap of the top side metal layer 161 on the sides of the CMUT cell 100a), and a movable membrane 120b thickness of 14 µm.

As an alternative to SOI substrates to reduce cost, the second substrate can comprise a standard silicon bulk substrate material which can be bonded to the thick dielectric regions 106 of the first substrate 101. In this embodiment, after bonding, the second substrate material can be thinned by backgrind and polishing to the desired target membrane thickness, such as 14 µm±5 µm thick.

FIGS. 2A-2G are cross-sectional diagrams showing processing progression for an example method of forming CMUT devices during different stages of fabrication, according to an example embodiment. Although the CMUT device is described being formed having a single element with a single CMUT sensor cell, as noted above disclosed CMUT devices may be formed having a plurality of CMUT elements each with one or more CMUT cells to form a CMUT array (see FIG. 3 described below).

Figure 2A:
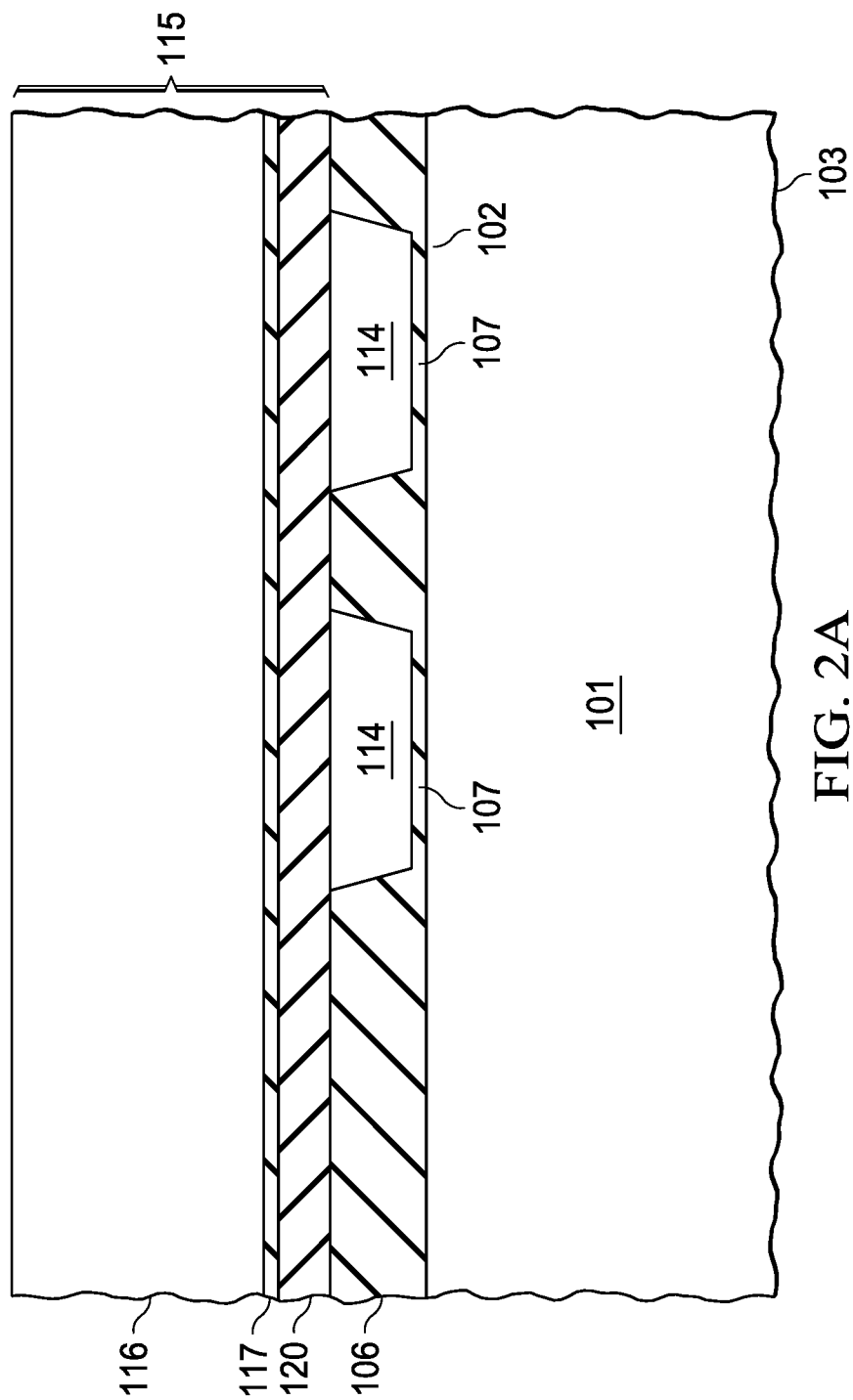
FIGS. 2A-G are cross-sectional diagrams showing processing progression for an example method of forming a CMUT device, according to an example embodiment.

The embodiment described as shown in FIGS. 2A is thus for illustration only and is one particular embodiment which describes formation of a CMUT device having a single CMUT element with a single CMUT cell 100a. Other techniques for forming disclosed CMUT devices can be used without departing from the scope of this disclosure, including forming CMUT devices including a plurality of disclosed CMUT elements. Several CMUT cells within a CMUT element can be connected in parallel by coupling together movable membranes 120b of CMUT cells in a given CMUT element, such as to increase the output pressure over a given area. Connecting CMUT cells in parallel reduces the impedance (for driving). The CMUT elements can be electrically isolated from one another for use independently to facilitate beam steering or for improved spatial resolution over a large area. One can also drive/sense the CMUT elements differentially to improve common mode signals or mitigate manufacturing asymmetries.

Thick dielectric regions 106, such as comprising a silicon oxide layer, are provided on a top side 102 of a first substrate 101. First substrate 101 can generally comprise any single crystal substrate material, including silicon-based substrates, or other substrates. The first substrate 101 provides a low substrate resistivity ≤0.1 Ω-cm, such as about 0.01 Ω-cm.

In one particular embodiment, to form thick dielectric regions 106 a thick silicon oxide layer is grown to a thickness of 4.5 µm to 5.5 µm using a high pressure oxidation (HiPOx) process. The use of HiPOx facilitates the rapid growth of thick thermal oxide layers and generally provides good thickness control across the die of typically less than 1%. One particular example set of HiPOx process conditions include a temperature of 1,000° C. at 25 atmospheres pressure in steam for 9.5 hours on virgin first substrates 101 (e.g., bulk single crystal silicon wafers), and the alignment marks for photolithography are etched later in the process.

As an alternative, thick dielectric regions 106 may also comprise conventional thermally grown silicon oxide (e.g., using a LOCal Oxidation of Silicon (LOCOS) process where silicon dioxide is formed in selected areas (here thick dielectric regions 106) on a silicon wafer generally using a silicon nitride as a mask to oxidation, or a deposited dielectric layer, including silicon oxide or other dielectric material. However, the LOCOS approach with conventional oxidation will generally not yield 5 µm thick (or thicker) oxide layers, and deposited dielectric (e.g., oxide) films will generally not provide less than 1% thickness control across the die.

The substrate vendor's laser scribe generally present can be used to ensure a minimum of surface contamination or roughness which will facilitate subsequent wafer bonding steps. Masking and etching of front side alignment marks can follow. Resist strip and a pre-clean process can help ensure a smooth surface for the thick dielectric regions 106 used later in the process for bonding the membrane layer 120 of the SOI substrate (e.g., wafer) 115 thereto.

A first masking level "CELLETCH" uses thick photoresist in order to support the subsequent etch through the thick dielectric regions 106 (e.g., thick silicon oxide layer) to initially begin to define at least one etched single cell CMUT element for each CMUT array/die on a wafer. A plasma etch which is non-polymerizing can be used for etching a first portion of the thick dielectric region 106, such as to etch about 4.65 µm of silicon oxide when thick dielectric regions 106 comprise silicon oxide and have a thickness of about 5 µm to 5.3 µm. A sidewall slope of ~80° is generally desirable and can be achieved from the natural resist erosion. The remaining portion of the thick dielectric region 106 (e.g., 0.5 µm silicon oxide) after plasma etch can be removed by wet etch that provides etch selectivity relative to the substrate material (e.g., Si) to avoid damaging the top side 102 of the first substrate 101.

About 50% of the top side 102 of the first substrate 101 (e.g., a wafer) will generally be open (exposed) during the etch of the thick dielectric region 106. The resist is then stripped (e.g., a wet strip process). Following an appropriate pre-oxidation clean, in an oxidation step a thin (e.g., 0.3 µm) CMUT cell oxide can be grown.

FIG. 2A shows a cross sectional depiction of the CMUT device in-process after bonding of a SOI substrate (e.g., wafer) 115 comprising a handle (e.g., wafer) 116, buried dielectric layer 117 (generally referred to in the art as a "buried oxide layer" or "(BOX) layer") 117 and membrane layer 120 (e.g., generally referred in the art as an "active layer"). The membrane layer 120 is bonded to the thick dielectric regions 106 of the first substrate 101.

The handle 116 being sacrificial represents any suitable semiconductor wafer formed from any suitable material(s), such as undoped or lightly-doped (n or p-doped) silicon. The buried dielectric layer 117 also being sacrificial can be any suitable layer(s) of electrically insulative material(s), such as a silicon oxide layer. The membrane layer 120 represents any suitable layer(s) of substrate material(s), such as doped single crystal silicon. In particular embodiments, the handle 116 represents a silicon wafer with a resistance of about 5 to 10 Ω-cm, the buried dielectric layer 117 represents a silicon oxide layer that is about 1.5 to 2.5 µm thick, and the membrane layer 120 represents doped silicon with a resistance of about 5 Ω-cm is about 14 µm±5 µm thick. For interconnection purposes between cells or elements, the membrane layer 120 can include a metal layer thereon which renders the pathway provided a low resistivity path.

For embodiments where the CMUT device/die includes a plurality of CMUT elements (a CMUT array), the membrane layer 120 will generally be electrically common for all the CMUT cells in each CMUT element. Each CMUT element can have a separate/unique top plate including a plurality of electrically connected movable membranes 120b with the element, which can be electrically connected through a dedicated TSV to the bottom side 103 of the first substrate 101. Low resistivity of the top plate of each CMUT element can be provided by subsequent metal deposition on the membrane layer 120 and patterning process steps as described below. Proper known bonding procedures including cleans and plasma pre-treatments can be used.

The bonding can comprise vacuum fusion wafer bonding. For vacuum fusion wafer bonding, as is commonly known in the art, attributes which ensure good wafer bonding include the bonding surfaces being smooth with a surface roughness typically less than 3A. Grown thermal oxide and silicon substrates generally satisfy this requirement. Prior to bonding the surfaces can be treated with an RCA clean (SC-1, where SC stands for Standard Clean, with a 1:1:5 solution of NH$_4$OH (ammonium hydroxide)+H$_2$O$_2$ (hydrogen peroxide)+H$_2$O (water) at 75 or 80° C. typically for 10 minutes. The second RCA clean step is a short immersion in a 1:50 solution of HF+H$_2$O at 25° C., in order to remove the thin oxide layer and some fraction of ionic contaminants. The third and last step RCA clean (called SC-2) is performed with a 1:1:6 solution of HCl+H$_2$O$_2$+H$_2$O at 75 or 80° C. This treatment effectively removes the remaining traces of metallic (ionic) contaminants. A N$_2$ plasma activation and a DI water rinse can follow. The vacuum bonding is typically performed at a pressure less than $8 \times 10^5$ mbar. As a final step the bonded surfaces are annealed in N$_2$ for several hours, such a 4 hour 1050° C. N$_2$ anneal.

The handle 116 is then removed after bonding, such as by backgrinding the handle 116 to about a 150 µm post-backgrind target, performing a second 4 hour 1050° C. anneal after backgrinding prior to a wet etch of the handle remaining after backgrind, and then wet etching the remaining handle. The handle remaining after backgrind when the handle 116 comprises silicon can be etched in a wet silicon etch, such as using a hydroxide (e.g., KOH or TMAH), stopping on the buried dielectric layer 117. The buried dielectric layer 117 is then removed, such as by a wet etch (e.g., a wet oxide etch for the buried oxide layer comprising silicon oxide) stopping on the membrane layer 120.

Masking and etching the movable membrane (e.g., silicon plate) 120b removes the membrane layer 120 over the alignment marks to reopen the alignment marks and enable proper alignment for subsequent process steps. Since the membrane layer 120 is generally a relatively thick layer for etching (e.g., about 14 µm thick), a Bosch etch can compensate for resist erosion during the etch of the membrane layer 120. As known in the art, the Bosch process, also known as pulsed or time-multiplexed etching, alternates repeatedly between two modes/phases to achieve nearly vertical etched structures.

Figure 2B:
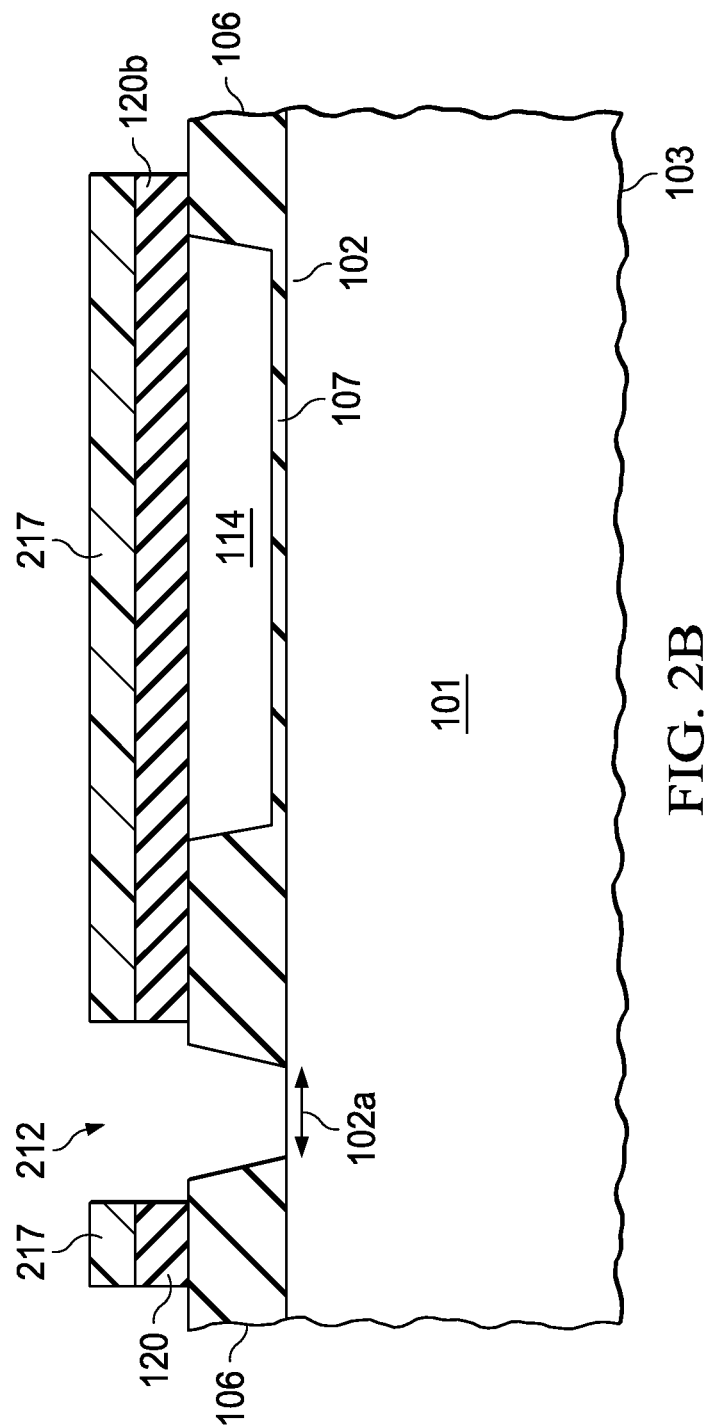

FIG. 2B shows a cross sectional depiction of the CMUT device in-process after the masking level "PLATESI" (Mask #2) which uses photoresist (resist) 217 to etch the membrane layer 120 to define at least one movable membrane 120b (e.g., a Si single crystal membrane), to separate the CMUT elements for CMUT devices having a plurality of CMUT elements, and to remove membrane layer 120 from the top side contact area 102a which will later become part of the TSV 111. This masking level can also be used to remove the thin dielectric region 107 over the top side contact area 102a. The etch of the membrane layer 120 stops on the thick dielectric region 106 and opens a void (aperture) 212 over the top side contact area 102a. A Bosch etch with a short cycle can be used to minimize side wall scalloping. The etch should be configured to not be reentrant. The thin dielectric region 107 over the top side contact area 102a is then etched using the resist 217 for the PLATESI masking level. The thick dielectric region 106 outside of the movable membrane 120b will only be thinned by ~0.3 µm by the etch of the thin dielectric region 107 (for thin dielectric region 107 being ~0.3 µm thick).

The resist 217 is then stripped. A top side metal layer 161, such as 0.5 µm thick AlCu metal layer, is then deposited. Top side metal layer 161 will provide the metallization for the top of movable membrane 120b and provide a trace that connects to the top side contact area 102a to contact the top side of the later formed TSV. A pre-sputter etch can ensure good electrical contact between top side metal layer 161 and the movable membrane 120b and to the top side contact area 102a. The addition of about 1,000 Å of TiW over the top side contact area 102a before adding top side metal layer 161, for example, can help ensure good contact to the later formed TSV.

Figure 2C:
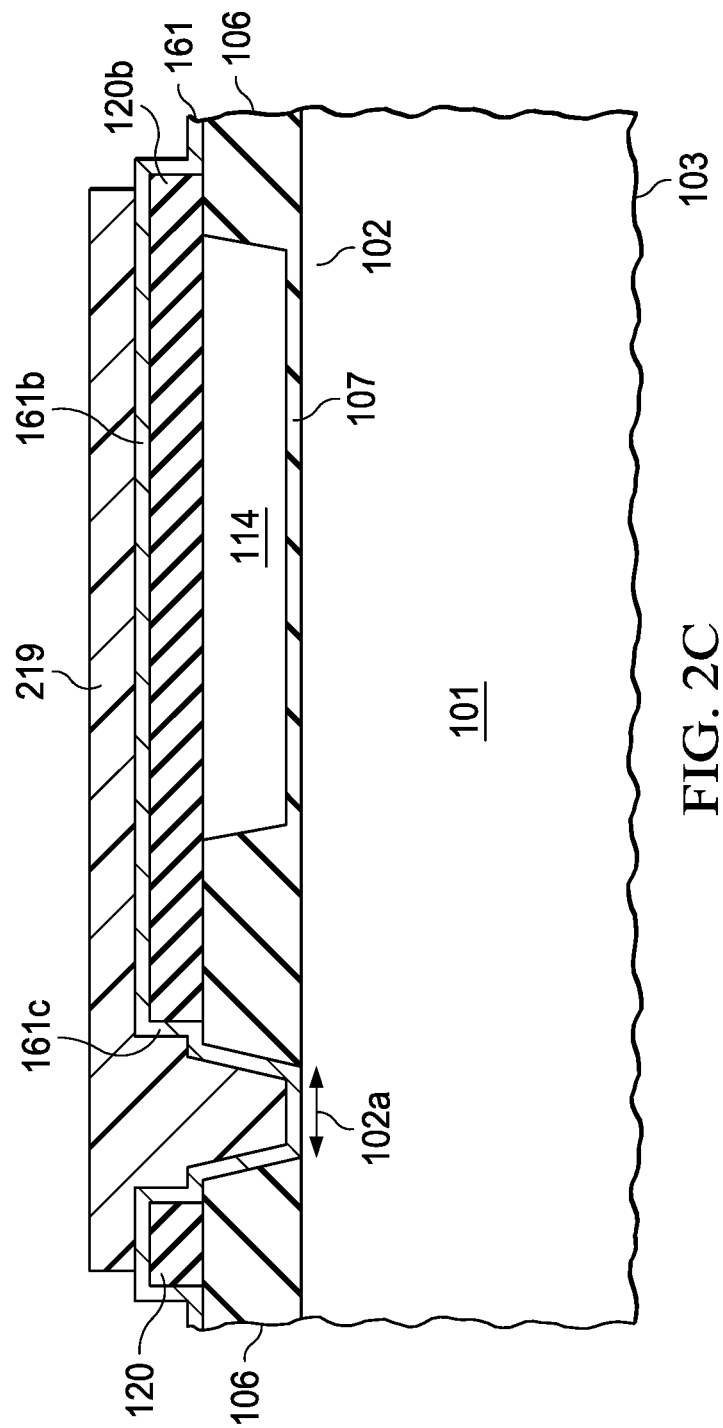
Figure 2D:
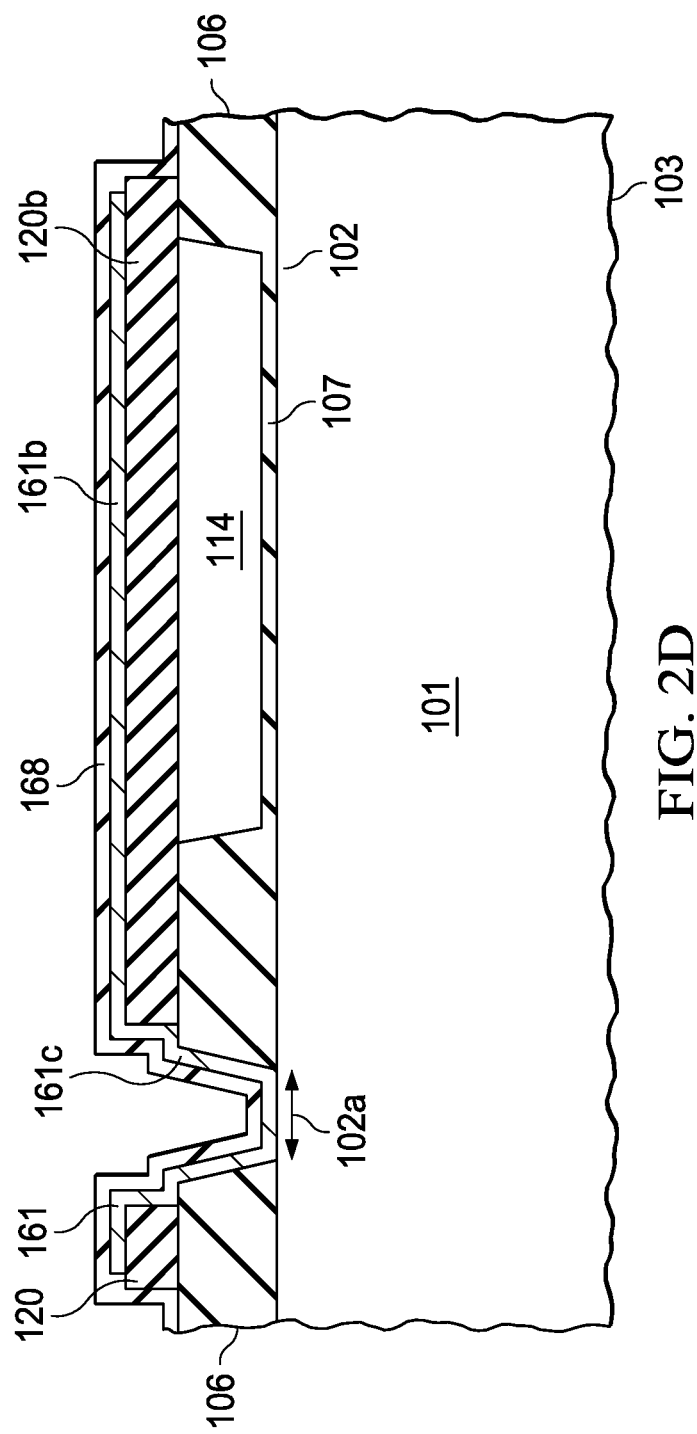

FIG. 2C shows a cross sectional depiction of the CMUT device in-process at the masking level "ALTOP" (Mask #3) which uses resist 219 to define/pattern the top side metal layer 161 (e.g., AlCu) over the CMUT cell(s). Thick resist for resist 219 will help for step coverage over the movable membrane 120b. The ALTOP CDs are shown smaller as compared to the movable membrane 120b dimension. The top side metal layer 161 can be wet etched from the field area using openings in the resist 219. The resist 219 is then stripped off FIG. 2D shows a cross sectional depiction of the CMUT device in-process after depositing a dielectric passivation layer 168, such as about 0.2 μm plasma tetraethyl orthosilicate (TEOS) derived silicon oxide layer then 0.2 μm plasma nitride passivation layer in one particular embodiment. Depending on the CMUT device application, a thicker layer for the dielectric passivation layer 168 stack may be helpful. A final alloy may then be performed, such as at 400° C. in $N_2+H_2$.

Optionally, a temporary wafer (carrier wafer) can be bonded to the in-process CMUT wafer, and the CMUT wafer thinned (e.g., backgrind) from its bottom side 103, such as from about 725 μm to reach a post backgrind thickness of ~400 μm. A 400 μm target thickness will generally still enable proper wafer handling during subsequent processing operations. If the first substrate 101 was not background or otherwise thinned, a step can be added to strip all bottom side (e.g., dielectric) film(s) thereon.

Figure 2E:
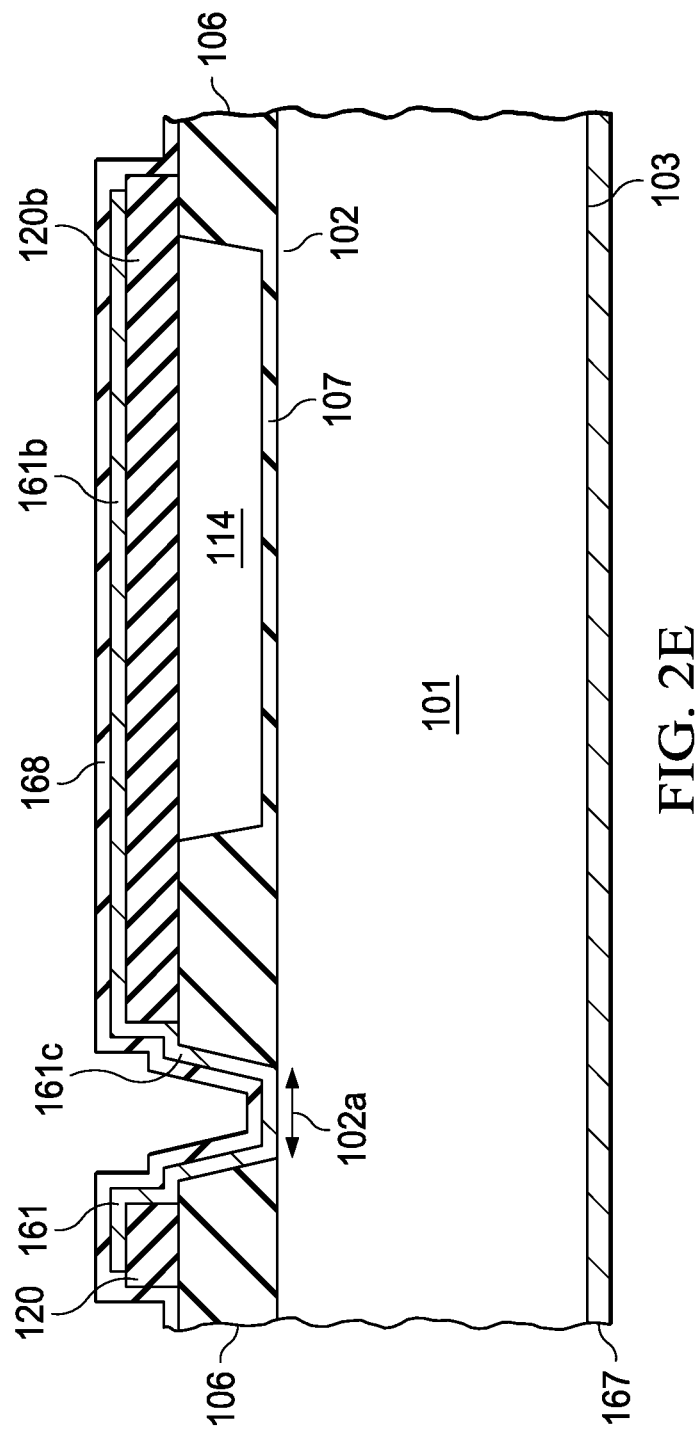

FIG. 2E shows a cross sectional depiction of the CMUT device in-process after depositing a backside metal layer 167 on the bottom side 103 of the first substrate 101, such as 1000 Å Ti+2800 Å Ni+1500 Å Ag in one particular embodiment. The bottom side 103 of the first substrate 101 should clean before the backside metal deposition. A pre-sputter etch of 300 Å can be used for the backside clean.

Figure 2F:
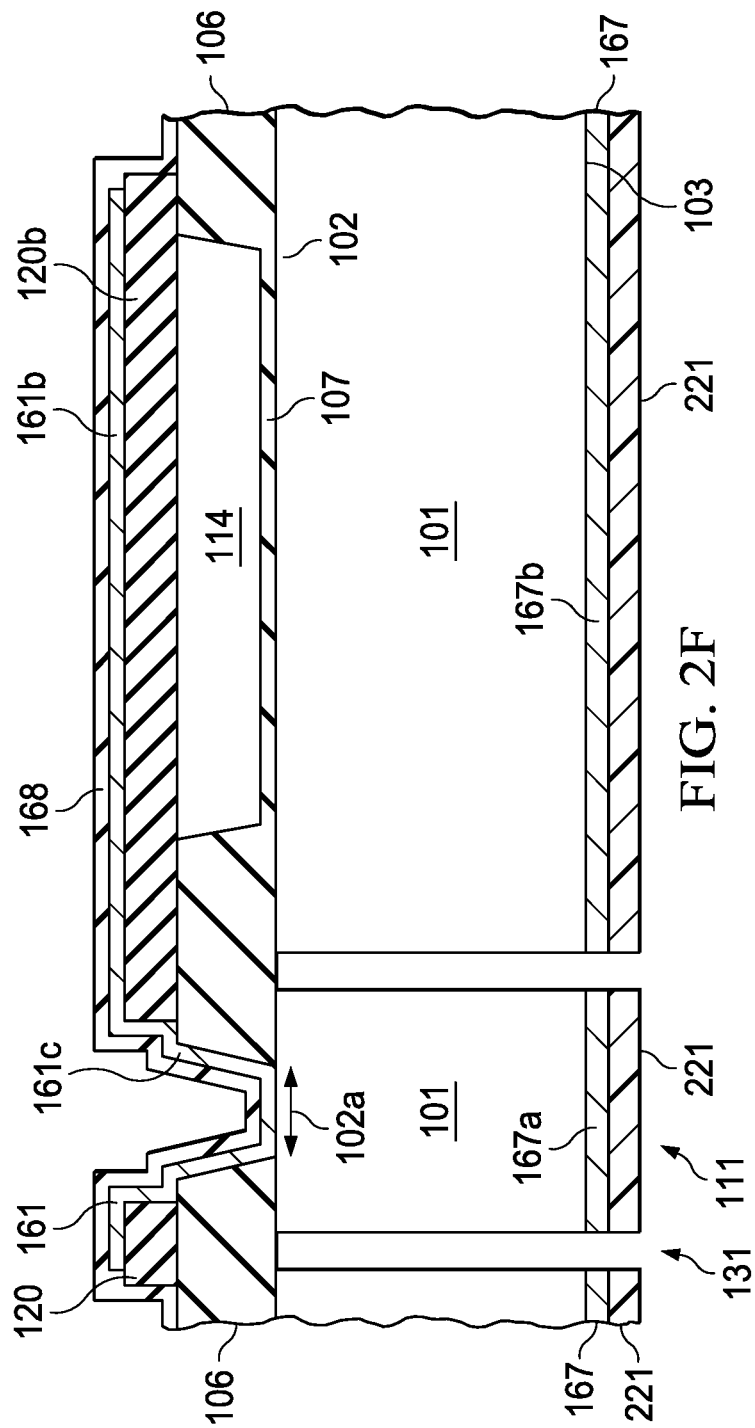

FIG. 2F shows a cross sectional depiction of the CMUT device in-process after the mask level "TSVDEF" (Mask #4) which uses resist 221 to protect the backside metal layer 167 over the area that will be TSV 111 and substrate (wafer) backside contact, and then etches an isolation region 131 (e.g., trench ring) through backside metal layer 167 and the full thickness of the first substrate 101 stopping on the thick dielectric layer 106, thus electrically isolating and defining each TSV, such as TSV 111 shown in FIG. 2F. Design rules can be relaxed so that backside alignment can be facilitated. The CMUT device 100 shown in FIG. 1B described above results after stripping resist 221 from the in-process CMUT structure shown in FIG. 2F.

The backside metal layer (e.g., TiNiAg) 167 can be wet etched. A Bosch etch can be used to etch the single crystal material (e.g., silicon) of the first substrate 101 to complete isolation regions 131, such as a 50 μm wide Si trench for silicon first substrates 101 for electrically isolating each TSV. This etch will stop on the thick dielectric regions 106 above the top side 102 of the first substrate 101. The breakdown voltage across the isolation regions 131 (e.g., trenches) will generally be greater than 3V/μm of width, thus providing 150 V for a 50 μm wide trench.

The isolation regions 131 (e.g., trenches) can be left open, or can be filled with a dielectric material. The resist 221 is then stripped. The CMUT wafer can then be diced (singulated) into a plurality of CMUT device die each including 1 or more CMUT elements, such as an example CMUT device (CMUT array) including a plurality of CMUT elements, such as each of the CMUT element including a plurality of CMUT cells 100a shown in FIGS. 1A and 1B having an electrically common movable membrane 120b (top electrode). The CMUT device/die can be bonded face up, such as onto a control die.

Figure 2G:
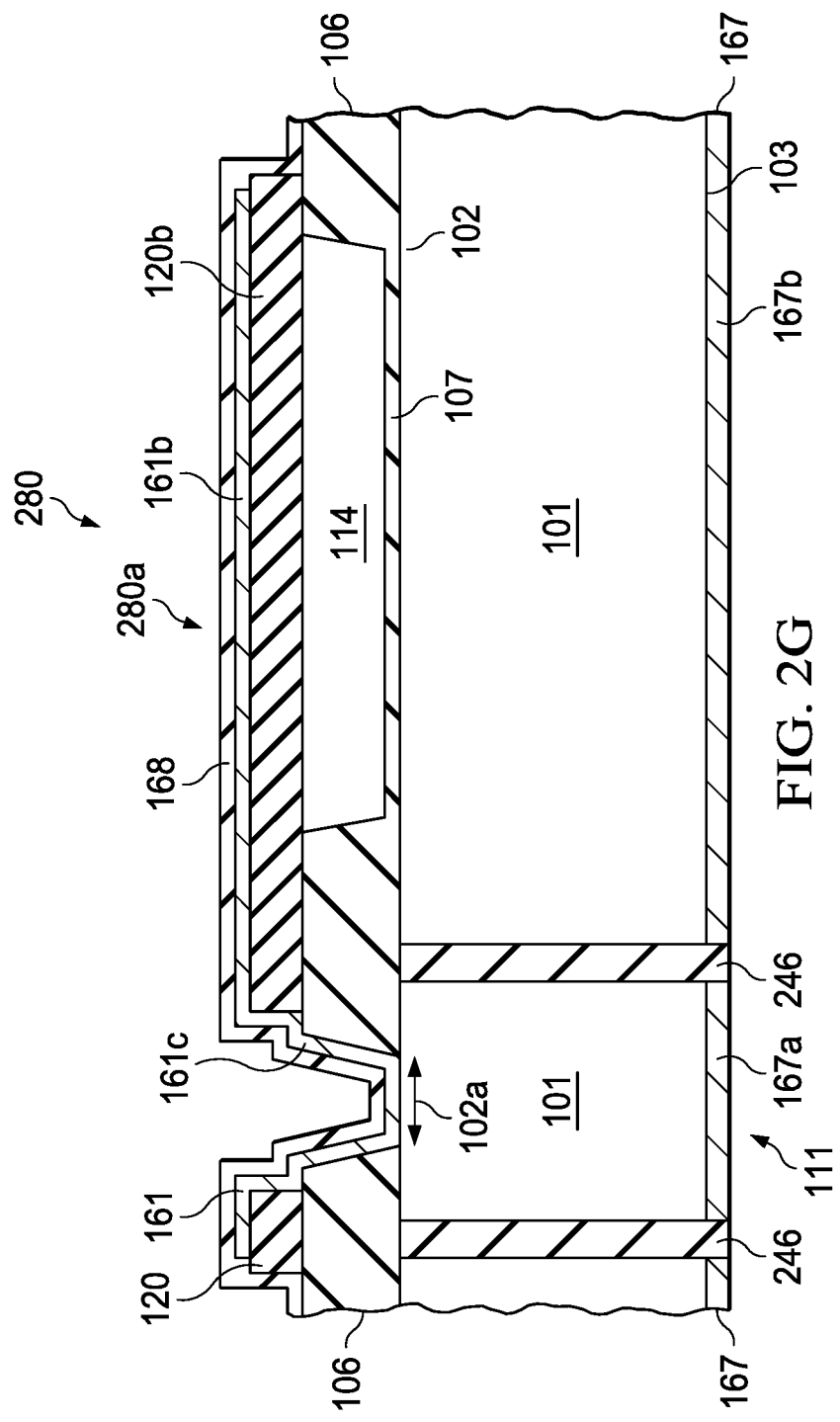

FIG. 2G shows a cross sectional depiction of a CMUT device 280 including a CMUT cell 280a having an optional solid dielectric filler 246 in the isolation regions 131 (e.g., trenches). Example materials for the solid dielectric filler 246 can include benzocyclobutene (BCB), polybenzoxazole (PBO), a polyimide, or a molding compound material (e.g., epoxy).) can raise the breakdown voltage across the isolation regions 131 to over 3V/μm of trench width.

Figure 3:
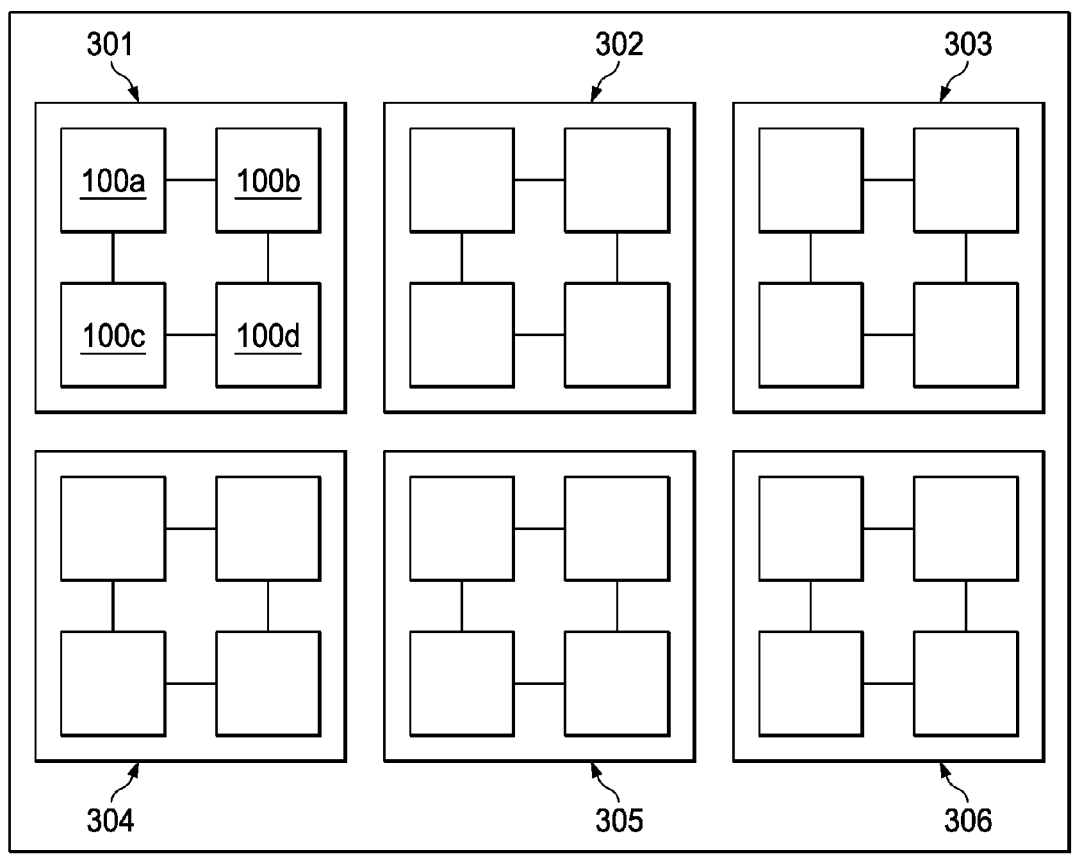
FIG. 3 is a top view depiction an example CMUT device including a plurality of CMUT elements each including a plurality CMUT cells shown in FIGS. 1A and 1B coupled together, according to an example embodiment.

FIG. 3 is a top view depiction an example CMUT device (die) 300 including a plurality of CMUT elements 301-306, with each capacitive MEMS element including four of the capacitive MEMS sensing cells 100a in FIGS. 1A and 1B shown as CMUT cells 100a-100d coupled together, according to an example embodiment. Although the CMUT device 300 is shown having six CMUT elements 301-306 with each CMUT element including four CMUT cells 100a-100d, disclosed CMUT devices can have any number of CMUT elements, each having any number of CMUT cells. The CMUT elements 301-306 can be electrically isolated from one another to allow the respective CMUT elements to be driven/sensed differentially to improve common mode signals or mitigate manufacturing asymmetries.

Advantages of disclosed CMUT devices include the full process using as few as 4 mask levels. Other advantages include enables smaller die size without the need for conventional bond pads which degrade performance, increase die size and require wire bonding to the couple to the ultrasonic transmitting surface (movable membrane 120b) on the top side of the CMUT device. Disclosed CMUT devices also simplify the packaging operation resulting in easy coupling to the transmitting medium, which reduces the packaging cost. Disclosed CMUT devices also facilitate the option of stacking the CMUT die on a control die since both electrodes are contacted from the bottom side of the CMUT device.

Disclosed embodiments can be used to form semiconductor die that may integrated into a variety of assembly flows to form a variety of different devices and related products. Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

What is claimed is:

1. A method of forming a capacitive micromachined ultrasonic transducer (CMUT) device including at least one CMUT element with at least one CMUT cell, comprising:

forming a patterned dielectric layer including a thick dielectric region and a thin dielectric region on a top side of a first substrate including a thin dielectric region over a top side substrate contact area on a top side surface of said first substrate, wherein said first substrate comprising a single crystal material, and wherein said single crystal material has a resistivity less than (<) 0.1 ohm-cm;

bonding a second substrate to said thick dielectric region to provide at least one sealed micro-electro-mechanical system (MEMS) cavity;

thinning said second substrate to reduce a thickness of said second substrate to provide a membrane layer;

etching said membrane layer to form a movable membrane over said MEMS cavity, and to remove said membrane layer over said top side substrate contact area;

removing said thin dielectric region from over said top side substrate contact area;

forming a top side metal layer over said top side substrate contact area and over said movable membrane including a trace portion coupling said top side substrate contact area to said movable membrane, and from a bottom side surface of said first substrate, etching to open an isolation trench around said single crystal material to form a through-substrate via (TSV) plug of said single crystal material at least under said top side substrate contact area which is electrically isolated from surrounding regions of said single crystal material.

2. The method of claim 1, wherein said forming said patterned dielectric layer comprises a high pressure oxidation (HiPOx) growth process.

3. The method of claim 1, further comprising forming a patterned metal layer on said bottom side surface of said first substrate including a first patterned layer portion contacting a bottom side of said TSV and a second patterned layer portion contacting said bottom side of said first substrate lateral to said TSV.

4. The method of claim 1, further comprising filling said isolation trench with a solid dielectric material.

5. The method of claim 1, wherein said single crystal material comprises single crystal silicon.

6. The method of claim 1, wherein said CMUT device includes a plurality of said CMUT elements, wherein each of said plurality of said CMUT elements include a plurality of said CMUT cells, wherein all of said movable membranes in each of said plurality of said CMUT elements are connected together so that said movable membranes in each of said plurality of CMUT elements are all addressable by contacting said TSV.

7. The method of claim 1, further comprising depositing at least one dielectric passivation layer on a top of said CMUT device including over said top side metal layer.

8. The method of claim 1, wherein said bonding comprises vacuum fusion bonding.

9. The method of claim 1, wherein said bonding said second substrate comprises bonding said membrane layer of a semiconductor on insulator (SOI) substrate having a handle and a buried dielectric layer in between said handle and said membrane layer, and said thinning said second substrate comprises removing said handle then removing said buried dielectric layer.

10. A method of forming a capacitive micromachined ultrasonic transducer (CMUT) device including at least one CMUT element with at least one CMUT cell, comprising:

forming a patterned dielectric layer including a thick dielectric region and a thin dielectric region on a top side of a first substrate including a thin dielectric region over a top side substrate contact area on a top side surface of said first substrate, wherein said first substrate comprising a single crystal material, and wherein said single crystal material has a resistivity less than (<) 0.1 ohm-cm;

vacuum fusion bonding a membrane layer of a semiconductor on insulator (SOI) substrate having a buried dielectric layer and a handle opposite said membrane layer to said thick dielectric region to provide at least one sealed micro-electro-mechanical system (MEMS) cavity;

removing said handle of said SOI substrate;

etching said membrane layer to form a movable membrane over said MEMS cavity, and to remove said membrane layer over said top side substrate contact area;

removing said thin dielectric region from over said top side substrate contact area;

forming a top side metal layer over said top side substrate contact area and over said movable membrane including a trace portion coupling said top side substrate contact area to said movable membrane, and from a bottom side surface of said first substrate, etching to open an isolation trench around said single crystal material to form a through-substrate via (TSV) plug of said single crystal material at least under said top side substrate contact area which is electrically isolated from surrounding regions of said single crystal material.

11. The method of claim 10, wherein said single crystal material comprises single crystal silicon.

\* \* \* \* \*